(12) United States Patent
Hida et al.

(10) Patent No.: US 7,247,973 B2
(45) Date of Patent: Jul. 24, 2007

(54) MOVING MECHANISM USING A PIEZOELECTRIC ACTUATOR AND A MAGNETIC DISK APPARATUS HAVING SUCH A MOVING MECHANISM

(75) Inventors: Masaharu Hida, Kawasaki (JP); Shigeyoshi Umemiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 177 days.

(21) Appl. No.: 10/972,558

(22) Filed: Oct. 25, 2004

(65) Prior Publication Data

US 2005/0285480 A1    Dec. 29, 2005

(30) Foreign Application Priority Data

Jun. 29, 2004    (JP) ............................. 2004-191472

(51) Int. Cl.
   *H01L 41/08*    (2006.01)
   *G11B 21/10*    (2006.01)
   *G11B 21/21*    (2006.01)

(52) U.S. Cl. .................. 310/328; 360/294; 360/294.3; 360/294.4

(58) Field of Classification Search ................ 310/328; 360/294
   See application file for complete search history.

(56) References Cited

U.S. PATENT DOCUMENTS

| 5,276,573 | A | * | 1/1994 | Harada et al. ............ 360/235.3 |
| 5,570,336 | A | * | 10/1996 | Inui et al. .................... 369/126 |
| 2002/0008942 | A1 | * | 1/2002 | Ezaki et al. ............. 360/245.3 |
| 2002/0118492 | A1 | * | 8/2002 | Watanabe et al. ......... 360/294.4 |
| 2003/0142448 | A1 | * | 7/2003 | Koganezawa ............ 360/294.4 |
| 2004/0136117 | A1 | * | 7/2004 | Kuwajima et al. ........ 360/294.4 |
| 2006/0163974 | A1 | * | 7/2006 | Park et al. .................. 310/348 |

FOREIGN PATENT DOCUMENTS

| JP | 7-073619 | 3/1995 |
| JP | 2001-084723 | 3/2001 |
| JP | 2001-167545 | 6/2001 |
| JP | 2002-074870 | 3/2002 |

* cited by examiner

*Primary Examiner*—Darren E. Schuberg
*Assistant Examiner*—J. San Martin
(74) *Attorney, Agent, or Firm*—Greer, Burns & Crain, Ltd.

(57) ABSTRACT

A moving mechanism using a piezoelectric actuator is attached by an adhesive with adhesive parts of a constant area between a piezoelectric element and a slider and between the piezoelectric element and a suspension. A movable part, serving as the slider, is moved by the piezoelectric actuator. A support part, serving as a gimbal part of a suspension, supports the piezoelectric actuator. At least one of the movable part and the support part is fixed to the piezoelectric element. At least one of the piezoelectric element, the movable part and the support part has a bonding surface that is defined by a level difference.

5 Claims, 7 Drawing Sheets

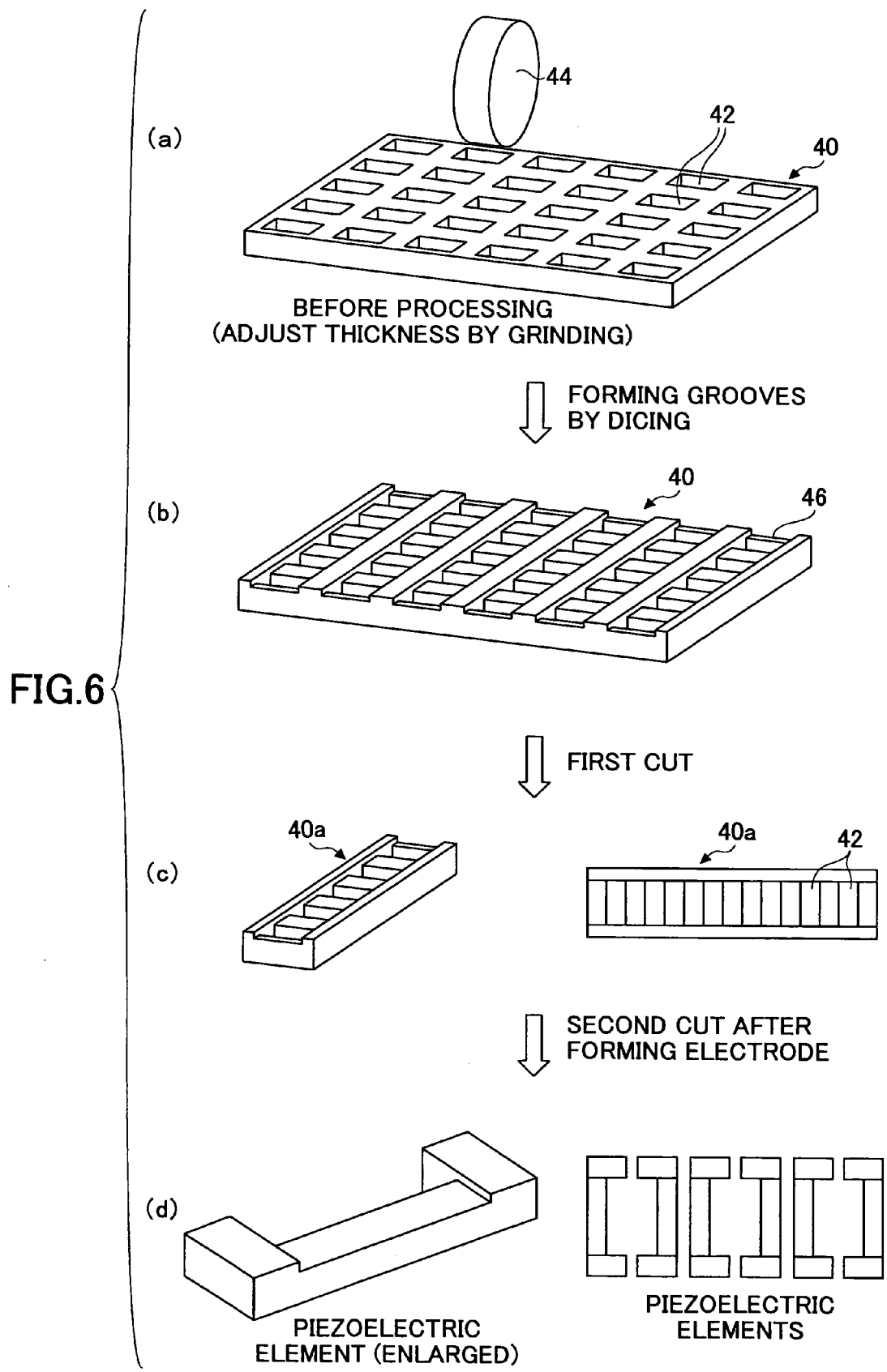

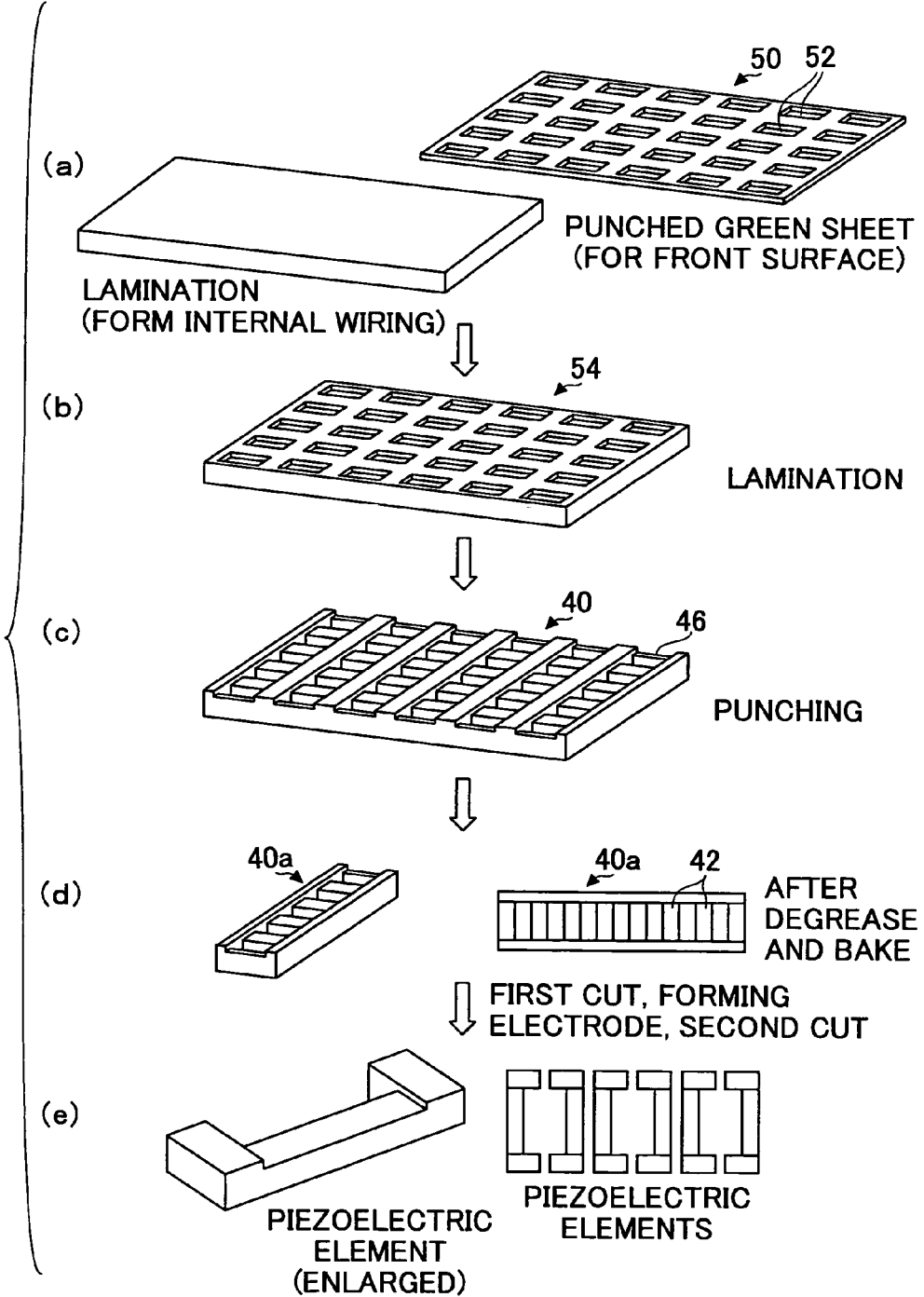

MOVING MECHANISM USING A PIEZOELECTRIC ACTUATOR AND A MAGNETIC DISK APPARATUS HAVING SUCH A MOVING MECHANISM

BACKGROUND OF THE INVENTION

1. Field of the Invention

The present invention generally relates to a moving mechanism using a piezoelectric actuator and, more particularly, to a magnetic disk apparatus having a micro moving mechanism for moving a magnetic head by an extremely small distance by using an actuator for moving the magnetic head using a piezoelectric element

2. Description of the Related Art

In recent years, miniaturization and precision of information equipments have progressed, and a demand for an actuator that can realize a minute movement with high accuracy is increasing. For example, a micro-actuator that can control a minute movement is required for a focus correction or an inclination angle control of an optical control or a head actuator of an ink-jet printer and a magnetic disk apparatus.

In such a situation, with an expansion in a market and a change to high-performance apparatus, an increase in a recording capacity is increasingly apt to be important. Generally, an increase in a storage capacity of a magnetic disk apparatus can be achieved by increasing a storage capacity per a single disk. In order to attain high recording density without changing a size of a disk, i.e., a diameter of a disk, it is indispensable to increase a number (TPI) of tracks per unit length, i.e., to reduce a width of each track. For this reason, it is required to achieve higher position accuracy of a head in a direction of width of a track, and development of a micro-actuator for a head that can achieve high positioning accuracy.

In conventional head positioning, a core-earth actuator provided in a fixing part of a suspension supporting a head (slider) has been used. Conventionally, this method was able to sufficiently cover a recording density of a medium. However, due to high-densification of recording density with recent increase in storage capacity of recording apparatuses, the positioning accuracy according to the conventional method becomes insufficient, which may cause occurrence of defects in reading and writing by a head.

Thus, as a method for improving positioning accuracy of a head, a method of providing a micro-actuator, which directly moves a slider, between the slider and a suspension is suggested (for example, refer to patent document 1 listed below). The micro-actuator is capable of minutely moving the head mounted on an end of an arm independently of an operation of a core-earth actuator. The following patent documents disclose conventional technique relevant to the present invention.

Patent Document 1: Japanese Laid-Open Patent Application No. 2002-74870

Patent Document 2: Japanese Laid-Open Patent Application No. 2001-167545

Patent Document 3: Japanese Laid-Open Patent Application No. 2001-84723

In the structure having a micro-actuator disclosed in the above patent document 1, there is a problem in that a variation may occur in the minute movement of a slider.

SUMMARY OF THE INVENTION

It is a general object of the present invention to provide an improved and useful moving mechanism of moving a head of a magnetic disk apparatus in which the above-mentioned problems are eliminated.

A more specific object of the present invention is to provide a moving mechanism using a piezoelectric actuator that is attached by an adhesive with adhesive parts of a constant area between the piezoelectric element and a slider having a magnetic head and between the piezoelectric element and a suspension.

In order to achieve the above-mentioned objects, there is provided according to one aspect of the present invention a moving mechanism using a piezoelectric actuator, comprising: a piezoelectric element constituting the piezoelectric actuator; a movable part moved by the piezoelectric actuator; and a support part supporting the piezoelectric actuator, wherein at least one of the movable part and the support part is fixed to the piezoelectric element, and at least one of the piezoelectric element, the movable part and the support part has a bonding surface that is defined by a level difference.

In the moving mechanism according to the present invention, the piezoelectric element may include a fixed part fixed by an adhesive to one of the movable part and the support part and an active part that is not fixed and deformable, and the level difference may be provided between the fixed part and the active part so that a distance between a surface of the active part and one of a surface of the movable part and a surface of the support part is larger than a distance between a surface of the fixed part and one of the surface of the movable part and the surface of the support part. The active part may have a strip-shape, and the fixed part may be integrally formed with each of opposite ends of the active part. The piezoelectric actuator may be a rotational actuator including a pair of the piezoelectric elements, and the rotational actuator may be provided between the movable part and the support part so as to rotate the movable part relative to the support part. The level difference may be in a range from 10 μm to 20 μm.

Additionally, there is provided according to another aspect of the present invention a magnetic disk apparatus comprising: a slider having a magnetic head; a gimbal part formed in a suspension supporting the slider; and a moving mechanism using a piezoelectric actuator to move the slider relative to the gimbal part, wherein the moving mechanism includes: a piezoelectric element constituting the piezoelectric actuator; a movable part moved by the piezoelectric actuator; and a support part supporting the piezoelectric actuator, wherein at least one of the movable part and the support part is fixed to the piezoelectric element, and at least one of the piezoelectric element, the movable part and the support part has a bonding surface that is defined by a level difference, and wherein the movable part serves as the slider and the support part serves as the gimbal part, and the piezoelectric actuator is provided between the slider and the gimbal part so as to move the slider relative to the gimbal part.

Further, there is provided according to another aspect of the present invention a method of forming a piezoelectric element for a piezoelectric actuator, the method comprising: forming a lamination sheet by laminating an electrode material and a piezoelectric raw-material sheet; forming a plurality of through openings in a line in the lamination sheet; baking the lamination sheet; forming a groove having a predetermined depth along a row of the through openings; and individualizing piezoelectric elements by cutting the lamination sheet so that a level difference is formed by the grooves, a lower part defined by the level difference serving as an active part, which is a deformable part of each of the piezoelectric elements, and a higher part defined by the level difference serving as a fixed part of each of the piezoelectric element, which is to be bonded by an adhesive to other members. The above-mentioned method may further comprise adjusting a thickness of the lamination sheet by grinding the lamination sheet prior to forming the grooves having the predetermined depth. The formation of the groove may be carried out by cutting using a dicing blade or grinding using an ultrasonic machining tool.

Additionally, there is provided according to another aspect of the present invention a method of forming a piezoelectric element for a piezoelectric actuator, the method comprising: forming a lamination sheet having openings by laminating a ceramics sheet having a predetermined thickness and having the openings in a line on a lamination of an electrode material and a piezoelectric ceramics raw-material sheet; forming a groove having a depth equal to the predetermined thickness along a row of the openings by forming through openings in the lamination sheet by punching; baking the lamination sheet; and individualizing piezoelectric elements by cutting the lamination sheet so that a level difference is formed by the groove, a lower part defined by the level difference serving as an active part, which is a deformable part of each of the piezoelectric elements and a higher part defined by the level difference serving as a fixed part of each of the piezoelectric element, which is to be bonded by an adhesive to other members.

According to the present invention, a slightly excessive amount of adhesive can be applied so as to prevent the adhesion area from being smaller than a designed adhesion area so that the adhesion parts between the movable part and the piezoelectric element and between the support part and the piezoelectric element are set to constant areas. If an amount of the adhesive is to much excessive, the level difference is provided between the adhesion part (fixed part) of the piezoelectric element and the non-adhesion part (active part) so as to acquire an accurate adhesion area by causing the excessive amount of adhesive to flow to a relatively large gap defined by the level difference. Thus, according to the present invention, a piezoelectric actuator which can achieve highly accurate positioning of the magnetic head relative to a high-density magnetic disk.

Other objects, features and advantages of the present invention will become more apparent from the following detailed description when read in conjunction with the accompanying drawings.

BRIEF DESCRIPTION OF THE DRAWINGS

FIG. 6 is an illustration of a manufacturing process of piezoelectric elements using a dicing process; and FIG. 7 is an illustration of a manufacturing process of piezoelectric elements using a punching process.

DETAILED DESCRIPTION OF THE PREFERRED EMBODIMENTS

A description will now be given, with reference to the drawings, of an embodiment of the present invention.

Figure 1:
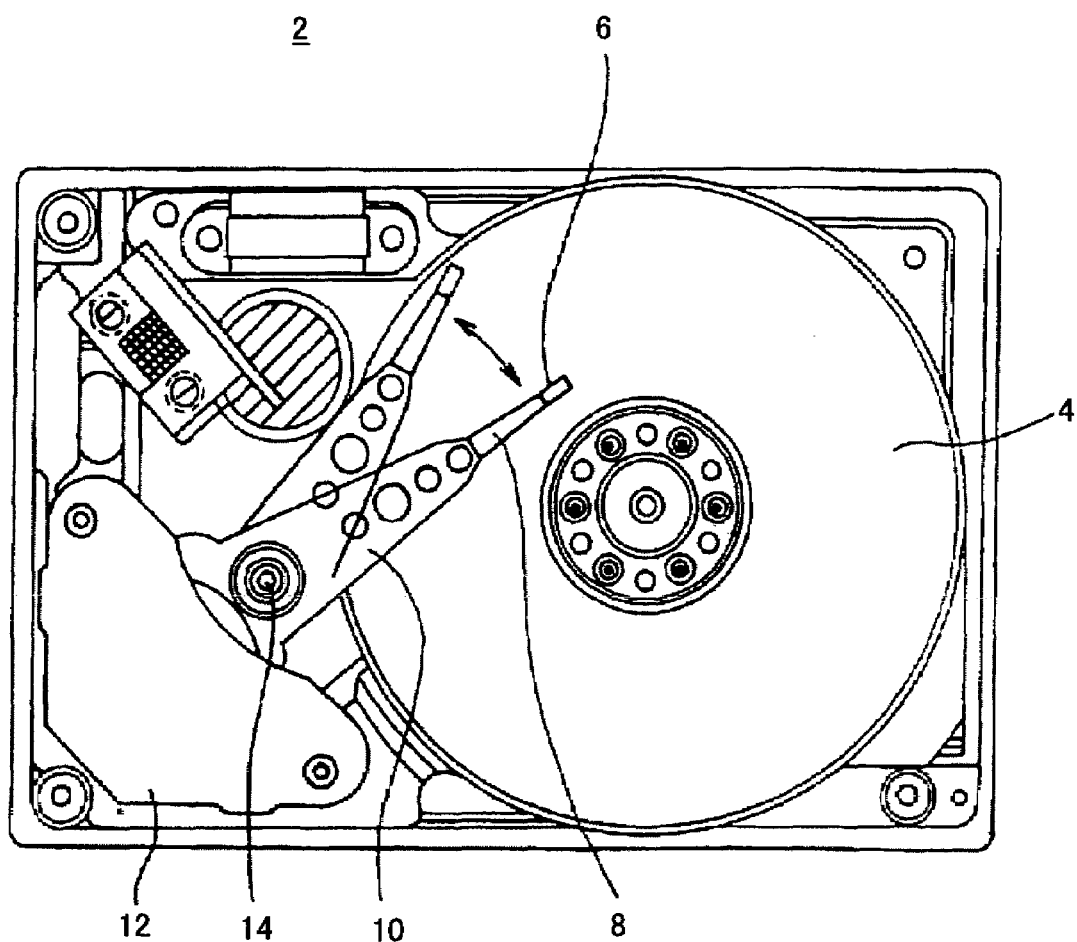
FIG. 1 is a plan view of a magnetic disk apparatus to which the present invention is applicable.

FIG. 1 is a plan view of a magnetic disk apparatus to which the present invention is applicable. The magnetic disk apparatus 2 shown in FIG. 1 comprises a rotatable magnetic disk 4 and a slider 6 having a magnetic head for reading information from the magnetic disk 4 and writing information on the magnetic disk 4.

The slider 6 is attached to an end of a suspension (a gimbal part 8a in FIG. 2) of a suspension 8, and the root part of the suspension 8 is fixed to a carriage arm 10. The carriage arm 10 is rotatable about an arm shaft 14 by electromagnetic actuator 12. Thereby, the slider 6 is movable in a radial direction (indicated by an arrow) of the magnetic disk 4.

In the magnetic disk apparatus 2 having the above-mentioned structure, a micro-actuator 20 as a minute moving mechanism, is provided between the slider 6 and the gimbal part 8a of the suspension 8. The micro-actuator 20 comprises a first piezoelectric element 22 and a second piezoelectric element 24, and is fixed to the gimbal part 8a and a slider 6 by an adhesive 26. Here, the micro-actuator 20 is a piezoelectric actuator, and the gimbal part 8a corresponds to a support part to which the piezoelectric actuator is fixed and supported and the slider 6 corresponds to a movable part that is moved or rotated by the piezoelectric actuator.

Specifically, a front surface of the end of the first piezoelectric element 22 is bonded to the gimbal part 8a, and a back surface of the opposite end of the first piezoelectric element 22 is bonded to the slider 6. Additionally, a front surface of the end of the second piezoelectric element 24 is bonded to the gimbal part 8a, and a back surface of the opposite end of the second piezoelectric element 24 is bonded to the slider 6.

Figure 2:
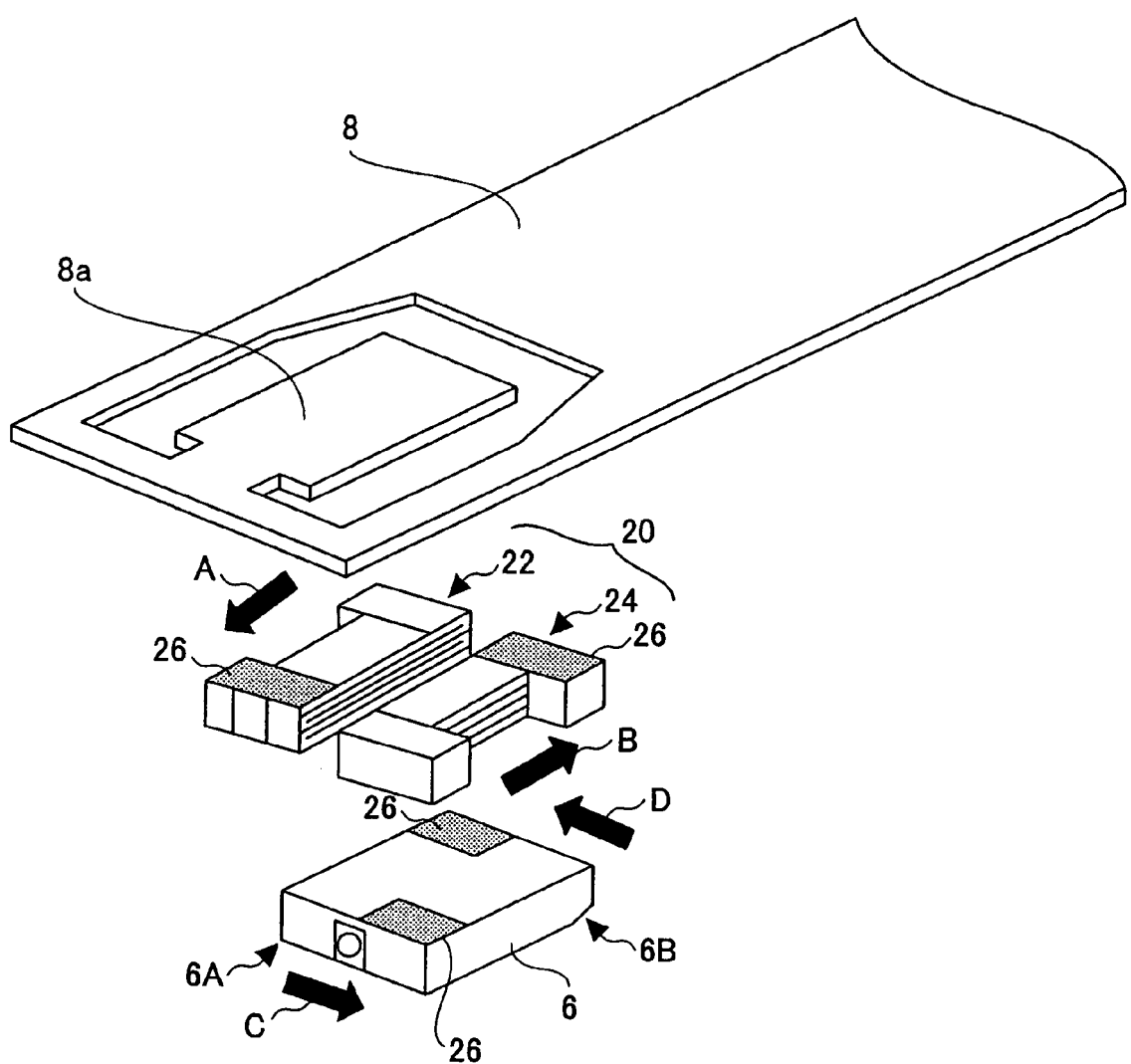
FIG. 2 is a perspective view of a structure of an end portion of a suspension shown in FIG. 1.

The first piezoelectric element 22 is constituted so as to be constricted in a direction of an arrow A in FIG. 2 when a voltage is applied thereto. On the other hand, the second piezoelectric element 24 is constituted so as to be constricted in a direction of an arrow B in FIG. 2 when a voltage is applied thereto. Therefore, when a voltage is applied to the first and second piezoelectric elements 22 and 24 simultaneously, the first piezoelectric element 22 is constricted and at the same time the second piezoelectric element 24 is constricted, and, thereby, a front end of the slider 6 moves in a direction indicated by an arrow C in FIG. 2 and a rear end moves in a direction indicated by an arrow D in FIG. 2. That is, the slider 6 rotates by a slight angle about the center of the micro-actuator consisting of the first and second piezoelectric elements 22 and 24.

By causing the magnetic head incorporated in the slider by the above-mentioned rotational movement, a minute positioning of the magnetic head incorporated in the slider 6 can be achieved. Although the amount of movement of the slider 6 depends on the size of the micro-actuator 20 and a magnitude of a voltage applied to the micro-actuator 20, in order to achieve the minute movement of the magnetic head, the amount of movement is set to 1 µm to 800 nm at corners of the slider 6 (indicated by 6A and 6B in FIG. 2).

That is, by rotating the slider mounting the head about a center of gravity of the slider, the magnetic head is moved minutely in a direction of width of a track. The inventors found that when performing the minute movement, there is a problem that a variation occurs in the amount of minute movement of the slider if a bonding area between the piezoelectric element and the slider and between the piezoelectric elements and the suspension.

Since an adhesive application area of the piezoelectric element is very small, the bonding area is reduced even if an amount of adhesive is slightly few, which causes a reduction in the adhesion strength. If the bonding area is smaller than a design value, there is a problem in that there is variation occurring in an amount of displacement of the slider. On the other hand, if the bonding area is slight greater, there is a problem in that even an active part (a part to be deformed) of the piezoelectric element is bonded, which results in a reduction in an amount of displacement of the slider.

Here, if an amount of application of the adhesive 26 fluctuates, the bonding areas between the gimbal part 8a and each of the piezoelectric elements 22 and 24 and the bonding areas between the slider 6 and each of the piezoelectric elements 22 and 24 are not constant, and there is a problem in that an amount of movement and a direction of movement are not constant. For example, in a case where the design is made so that the corner 6A of the slider 6 is displaced by 850 nm and the corner 6B is displaced symmetrically by 850 nm on the assumption that the bonding areas are constant, if the bonding areas of the piezoelectric elements 22 and 24 with respect to the slider 6 fluctuate, it may result in that the corner 6A of the slider is displaced by 850 nm but the corner 6B is displaced by 750 nm.

Thus, in the present embodiment, a step is provided on the front surface and the back surface of the piezoelectric elements 22 and 24 so that bonding areas of the piezoelectric elements 22 and 24 are maintained constant even if the amount of application of the adhesive 26 fluctuates. That is, as shown in FIG. 3, the fixed parts on opposite ends of each of the piezoelectric elements 22 and 24 are set slightly higher than the active parts (parts constricted or elongated by applying a voltage) between the fixed parts.

Figure 3:
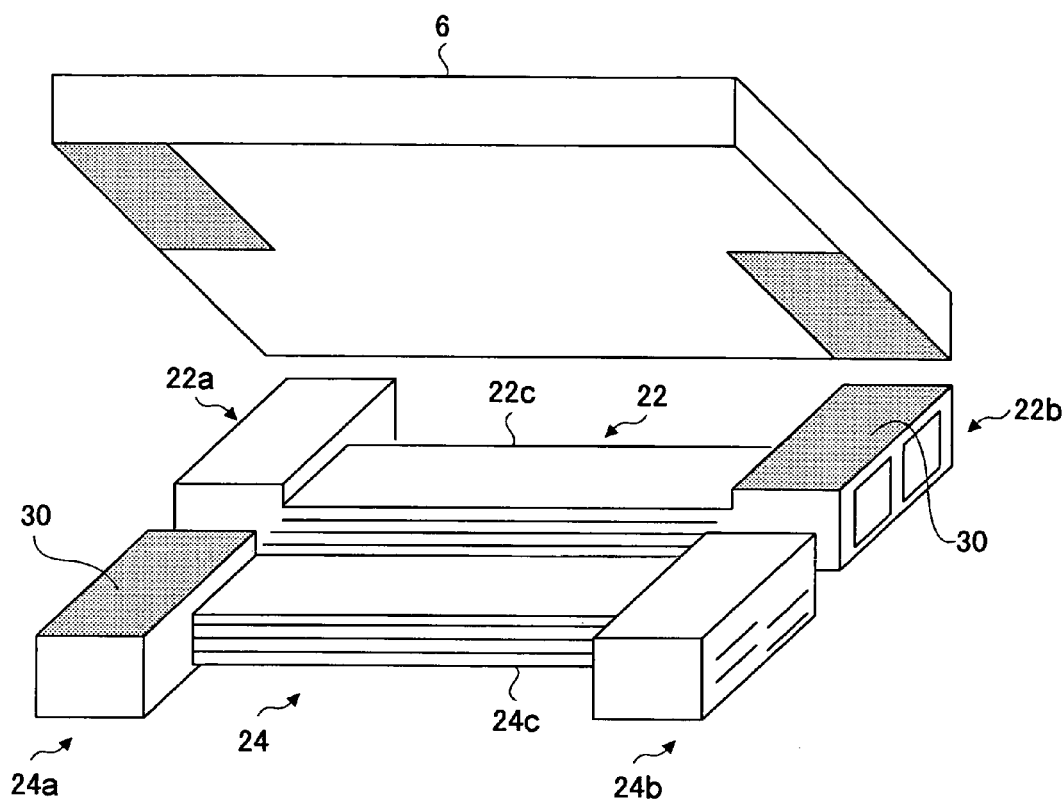
FIG. 3 is an enlarged perspective view of a slider and piezoelectric elements in a separated state.

FIG. 3 is an enlarged perspective view of the slider 6 and the piezoelectric elements 22 and 24 in a separated state. Each of the piezoelectric elements 22 and 24 which constitute the micro-actuator 20 has the fixed parts 22a and 22b; 24a and 24b on the opposite ends in the longitudinal direction. An elongated strip-shaped active part 22c extends between the fixed parts 22a and 22b, and the fixed parts 22a and 22b move in opposite directions to be closer to each other due to the constriction of the active part 22c. Additionally, an elongated strip-shaped active part 24c extends between the fixed parts 24a and 24b, and the fixed parts 24a and 24b move in opposite directions to be closer to each other due to the constriction of the active part 24c.

Formed on each of the front surface and the back surface of each of the fixed pars 22a and 22b; 24a and 24b is an adhesive application part 30 having a bonding surface defined by the step. The fixed parts 22a and 24a are fixed to the slider 6 by applying the adhesive 26 onto the bonding surface of the adhesive application parts 30 and mounting the slider 6 on the piezoelectric elements 22 and 24. On the other hand, the fixed parts 22a and 24b of the piezoelectric elements 22 and 24 are maintained movable with respect to the slider 6 without being bonded. The fixed parts 22a and 24b, which are not bonded, are defined by the same steps as the fixed parts 22b and 24a, and, for example, it is constituted that when the slider 6 is mounted for bonding, the slider 6 is substantially parallel to the piezoelectric elements 22 and 24.

Although only the mounting structure between the slider 6 and the piezoelectric elements 22 and 24 is shown in FIG. 3, the same is applied to the mounting structure between the gimbal part 8a and the piezoelectric elements 22 and 24. However, when mounting the piezoelectric elements 22 and 24 to the gimbal part 8a, the adhesive 26 is applied to the adhesive application parts 30 of the fixed parts 22a and 24a opposite to the fixed parts 22b and 24a bonded to the slider 6, respectively, and the piezoelectric elements 22 and 24 are fixed to the gimbal part 8a.

Figure 4:
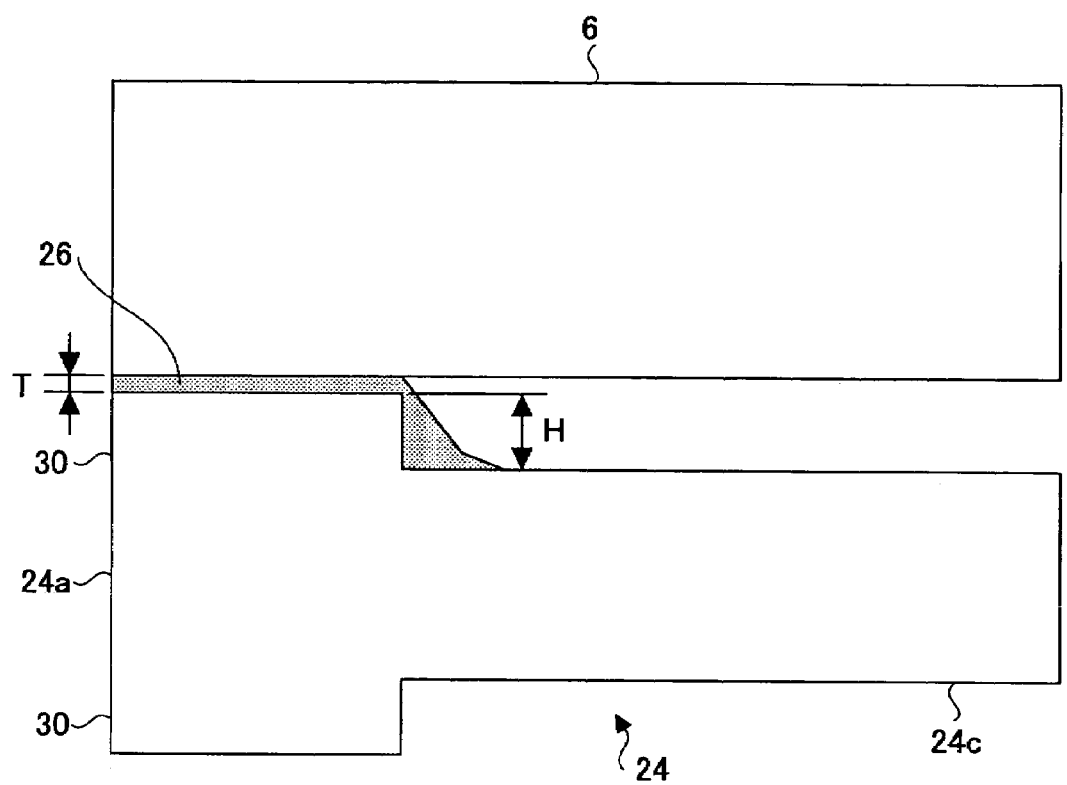
FIG. 4 is a cross-sectional view of an adhesion part between the slider and the piezoelectric elements.
Figure 5:
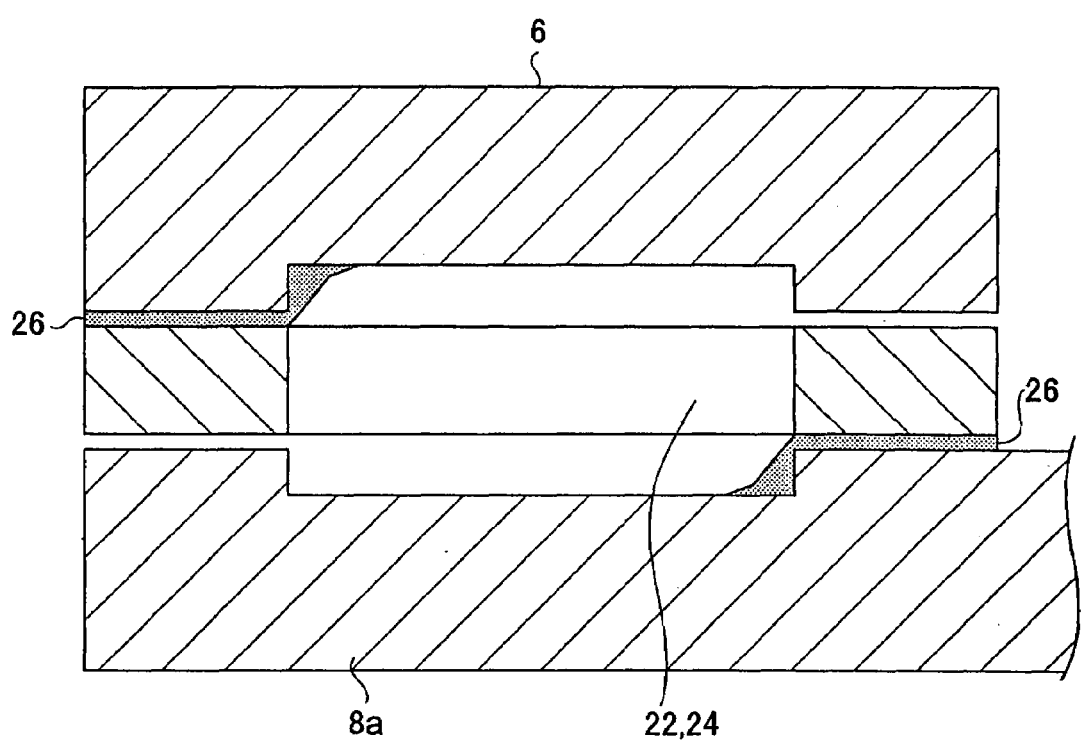
FIG. 5 is an enlarged cross-sectional view of a part including steps provided in a slider and a gimbal part to define bonding surfaces.

FIG. 4 is a cross-sectional view showing adhesion between the piezoelectric element 24 and the slider 6. The liquid-state adhesive 26 is applied to the bonding surface of the adhesive application part 30 of the piezoelectric element 24 by a dispenser, and a slider is mounted on it. As for the adhesive 26, a UV-curable adhesive, a heat-curable adhesive or an adhesive of mixture of the aforementioned may be used. An amount of application of the adhesive 26 is set to be slightly larger than an amount by which the adhesive is sufficiently applied over the entire surface (bonding surface) of the adhesive application part 30. Therefore, the adhesive is applied to the entire part between the adhesive application part 30 and the slider 6, and an excessive amount of the adhesive 26 flows out of the part between the adhesive application part 30 and the slider 6 so that the excessive amount of the adhesive 26 is retained at the corner formed by a surface of the active part 24c and a side surface of the adhesive application part 30 as shown in FIG. 4.

A thickness T of the adhesive 26 is set to about 5 micrometers between the slider 6 and the adhesive application part 30. The step (level difference) H between the surface (bonding surface) of the adhesive application part 30 and the surface of the active part 24c is set in a range of 10 μm-50 μm, preferably, a range of 10 μm-20 μm. Due to the step (level difference) H of this level, the adhesive 26 flows to the surface side of the lower active part 24c, and the part to which the adhesive 26 adheres is only the portion facing the adhesive application part 30.

It should be noted that the side surface of the adhesive application part 30 is perpendicular to the surface of the adhesive application part 30 in FIG. 4, it is not limited to be perpendicular and the side surface may be an inclined surface. However, in order to cause the adhesive 26, which flows out, to immediately separate from the surface of the slider 6, the side surface of the step of the adhesive application part 30 is preferably perpendicular to the surface of the front surface of the adhesive application part 30.

The structure of the above-mentioned adhesion part is applied to the adhesion part between the piezoelectric element 22 and the slider 6, and also to the adhesion part between the gimbal part 8a and the gimbal part 8a and the piezoelectric element 22a and 24.

Furthermore, although the step (level difference) is provided so as to form the bonding surface of each of the adhesive application parts 30 in the present embodiment, the bonding surfaces or the adhesive application parts defined by the step may be provided on the gimbal part 8a or the slider 6.

According to the above-mentioned structure, in a case where the adhesive is excessively applied so as to prevent the bonding area from being reduced, the excessive adhesive 26 does not bond or fix the active part 24c, which is not a part to be bonded, is not bonded or fixed to the slider, and only the adhesive application part 30. Thereby, the bonding areas between the piezoelectric elements 22 and 24 and the slider 6 can be made constant, and variation in the amount of movement of the micro-actuator 20 can be controlled.

Consequently, the positioning of the magnetic head can be performed by stably driving the micro-actuator 20 with high accuracy. Due to the supplemental drive of the magnetic head using the micro-actuator 20, the magnetic head can be positioned with sufficient accuracy in response to a recording medium (magnetic disk) of high-density recording.

A description will now be given of a manufacturing method of the piezoelectric elements 22 and 24 which constitute the above-mentioned micro-actuator 20. As a manufacturing method of the piezoelectric elements 22 and 24, there are considered a method using dicing processing, a method using ultrasonic processing and a method using punching processing in a process step of laminating piezoelectric elements.

A description will be given first, with reference to FIG. 6, of the method using dicing processing.

First, a desired number of Pt sheets are screen-printed on a PNN-PT-PZ ceramics green sheet (piezoelectric ceramics raw-material sheet) so as to form a ceramics lamination sheet 40, which is a sheet-like lamination. After forming rectangular through openings 42 by punching processing in the lamination sheet 40, the lamination sheet 40 is baked so as to be an assembly of piezoelectric elements. Subsequently, the lamination sheet 40 is grinded so as to have a predetermined thickness. Thereafter, cut-in is provided by cutting the lamination sheet 40 by using a dicing blade 44 along the rows of the through openings of the ceramics lamination sheet 40 (refer to FIG. 6-(a)) so as to form grooves 46 having a predetermined depth (for example, 10 micron to 20 micron) on the lamination sheet 40 (refer to FIG. 6-(b)). The depth of the grooves 46 is equivalent to the level difference H of the adhesive application part of the completed piezoelectric element.

After forming the grooves, the lamination sheet is cut between the grooves so as to divide into strip-like parts 40a each having the openings aligned in a row (refer to FIG. 6-(c)). Thereafter, parts to be drive electrodes of each piezoelectric element are formed on a side surface of the strip-like part 40, and each of the strip-like parts 40a is cut along the center of the strip openings and along a line between the openings so as to form the piezoelectric elements (refer to FIG. 6-(d)).

The method using ultrasonic processing is basically the same as the method using dicing processing, but the grooves 46 are formed by polishing by the ultrasonic processing instead of using a dicing blade.

A description will now be given, with reference to a method of using punching processing in a process step of laminating piezoelectric elements. First, a desired number of Pt electrodes are laminated on a PNN-PT-PZ ceramics green sheet by screen printing, and a green sheet 50, in which a plurality of openings 52 are formed by punching processing on the lamination sheet, is further laminated on the lamination sheet so as to form a lamination sheet 54, which is a lamination with openings (refer to FIG. 7-(a) and 7-(b)). Here, a thickness of the green sheet 50 is equivalent to the level difference H of the completed piezoelectric elements.

Thereafter, in the row of the openings 52, a part between the adjacent openings 52 is removed by punching processing with the same width as the openings 52 so as to form a lamination sheet 56. Thereby, the lamination sheet 56 is formed with grooves equivalent to the level difference H. Then, after degreasing and baking the lamination sheet 56, the lamination sheet 56 is divided into belt-like parts so that the openings are strip-shape, and, then, electrodes are formed (refer to FIG. 7-(d)). Then, the piezoelectric elements are individualized by the same manner as indicated in FIG. 6-(d) (refer to FIG. 7-(e)).

As mentioned above, the piezoelectric elements 22 and 24 each having the adhesive application part 30 can be formed by various methods. The inventors formed the piezoelectric elements 22 and 24 having the adhesive application part 30 according to the above-mentioned methods, and made the micro-actuator by providing the piezoelectric elements 22 and 24 between the slider 6 and the gimbal part 8a, and measured a displacement of the slider 6 by applying a voltage of 30 V. As a result of the measurements, it was confirmed that the variation in the amount of displacement is reduced, which realizes an improved micro-actuator.

The present invention is not limited to the specifically disclosed embodiments, and variations and modifications may be made without departing the scope of the present invention.

The present application is based on Japanese priority application No. 2004-191472 filed Jun. 29, 2004, the entire contents of which are hereby incorporated by reference.

What is claimed is:

1. A moving mechanism using a piezoelectric actuator, comprising:
   a piezoelectric element constituting the piezoelectric actuator;
   a movable part moved by the piezoelectric actuator; and
   a support part supporting the piezoelectric actuator,
   wherein at least one of said movable part and said support part is fixed to said piezoelectric element, and at least one of said piezoelectric element, said movable part and said support part has a bonding surface that is defined by a level difference, and
   wherein said piezoelectric element includes a fixed part fixed by an adhesive to one of said movable part and said support part and an active part that is not fixed and deformable, and said level difference is provided between the fixed part and the active part so that a distance between a surface of said active part and one of a surface of said movable part and a surface of said support part is larger than a distance between a surface of said fixed part and one of the surface of said movable part and the surface of said support part.

2. The moving actuator as claimed in claim 1, wherein said active part has a strip-shape, and said fixed part is integrally formed with each of opposite ends of said active part.

3. The moving mechanism as claimed in claim 2, wherein said piezoelectric actuator is a rotational actuator including a pair of said piezoelectric elements, and the rotational actuator is provided between said movable part and said support part so as to rotate said movable part relative to said support part.

4. The moving mechanism as claimed in claim 1, wherein said level difference is in a range from 10 μm to 20 μm.

5. A magnetic disk apparatus comprising:
   a slider having a magnetic head;
   a gimbal part formed in a suspension supporting the slider; and
   a moving mechanism using a piezoelectric actuator to move the slider relative to the gimbal part,
   wherein said moving mechanism includes:
   a piezoelectric element constituting the piezoelectric actuator;
   a movable part moved by the piezoelectric actuator; and
   a support part supporting the piezoelectric actuator,
   wherein at least one of said movable part and said support part is fixed to said piezoelectric element, and at least one of said piezoelectric element, said movable part and said support part has a bonding surface that is defined by a level difference, wherein said movable part serves as said slider and said support part serves as said gimbal part, and said piezoelectric actuator is provided between said slider and said gimbal part so as to move said slider relative to said gimbal part, and wherein said piezoelectric element includes a fixed part fixed by an adhesive to one of said movable part and said support part and an active part that is not fixed and deformable, and said level difference is provided between the fixed part and the active part so that a distance between a surface of said active part and one of a surface of said movable part and a surface of said support part is larger than a distance between a surface of said fixed part and one of the surface of said movable part and the surface of said support part.

* * * * *